(12) United States Patent
Ueshima (10) Patent No.: US 9,265,091 B2
(45) Date of Patent: Feb. 16, 2016

(54) FILAMENT LAMP FOR HEATING

(71) Applicant: USHIO DENKI KABUSHIKI KAISHA, Chiyoda-ku, Tokyo (JP)

(72) Inventor: Yukio Ueshima, Himeji (JP)

(73) Assignee: USHIO DENKI KABUSHIKI KAISHA, Chiyoda-Ku, Tokyo (JP)

( * ) Notice: Subject to any disclaimer, the term of this patent is extended or adjusted under 35 U.S.C. 154(b) by 237 days.

(21) Appl. No.: 13/952,153

(22) Filed: Jul. 26, 2013

(65) Prior Publication Data

US 2014/0091079 A1   Apr. 3, 2014

(30) Foreign Application Priority Data

Oct. 1, 2012   (JP) .................................. 2012-219303

(51) Int. Cl.
   *H05B 3/10*   (2006.01)
   *H05B 3/00*   (2006.01)
   *H01L 21/67*  (2006.01)

(52) U.S. Cl.
   CPC ........ *H05B 3/0033* (2013.01); *H01L 21/67115* (2013.01)

(58) Field of Classification Search
   CPC . H05B 3/003; H05B 3/0047; H01L 21/67115
   See application file for complete search history.

(56) References Cited

U.S. PATENT DOCUMENTS 6,081,072 A * 6/2000 Suzuki ............................ 315/46

FOREIGN PATENT DOCUMENTS

| JP | 11-176389 A | 7/1999 |
| JP | 2010-086985 A | 4/2010 |

\* cited by examiner

*Primary Examiner* — Shawntina Fuqua
(74) *Attorney, Agent, or Firm* — Fitzpatrick, Cella, Harper & Scinto (57) ABSTRACT

Disclosed herein are a filament lamp for heating a disk-shaped workpiece in such a way that the filament lamp rotates relative to the workpiece and radiates light thereonto. Further, the present invention provides a structure that enables the filament lamps to uniformly heat the workpiece even with respect to the radial direction of the workpiece. For this, the filament lamp includes an arc-shaped emitting part which extends in a circumferential direction of the relative rotation, and an auxiliary emitting part which is disposed inside a circle extending along the arc-shaped emitting part and extends from the arc-shaped emitting part in a direction crossing the circle. In addition, the present invention is configured such that areas of the workpiece that correspond to spaces between the arc-shaped emitting parts of the adjacent filament lamps pass just below the corresponding auxiliary emitting parts.

8 Claims, 11 Drawing Sheets

(Prior Art)

FIG. 11

FILAMENT LAMP FOR HEATING

CROSS REFERENCE TO RELATED APPLICATION

This application claims the benefit of Japanese Patent Application No. 2012-219303, filed on Oct. 1, 2012, which is hereby incorporated by reference in its entirety into this application.

BACKGROUND OF THE INVENTION

1. Technical Field

The present invention relates generally to filament lamps for heating disk-shaped workpieces and, more particularly, to a filament lamp for heating a semiconductor wafer in such a way that the filament lamp and the semiconductor wafer rotate relative to each other.

2. Description of the Related Art

As is well known to those skilled in the art, filament lamps are widely used as heating sources for heat treatment such as annealing, oxidation, diffusion when forming a film such as an oxide film, a metal film or a semiconductor film on a substrate, e.g. a semiconductor wafer, or the like.

A heating apparatus using such a heating source is generally configured such that the heating source heats a workpiece when the workpiece is rotating. This technique was disclosed in Japanese Patent Application Publication No. 2010-086985 (Prior Art Document 1).

Figure 9:
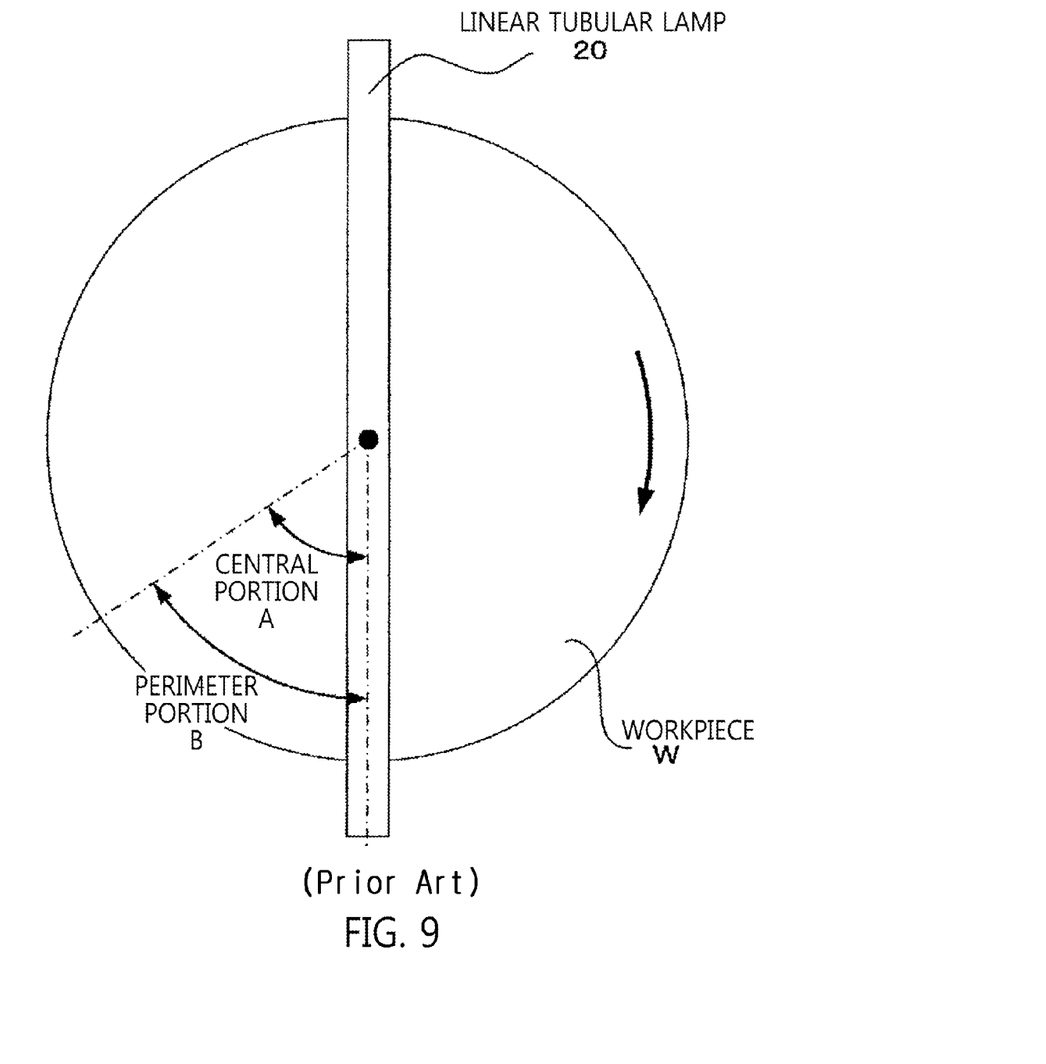
FIG. 9 is a plan view of a conventional technique.

However, the conventional heating apparatus uses a linear tubular lamp, which may easily cause nonuniformity in light radiation between a central portion and a perimeter portion of a workpiece. FIG. 9 shows this nonuniformity phenomenon. When a linear tubular lamp 20 radiates light onto a workpiece W that is rotating, a light radiation rate is different between a central portion A and a perimeter portion B of the workpiece W. As a result, the central portion A of the workpiece W is heated to a high temperature, while the perimeter portion B thereof is heated to a lower temperature. As such, if the overall area of the workpiece W is not uniformly heated, it is impossible to reliably and uniformly process the workpiece. This causes a defective product.

Figure 10:
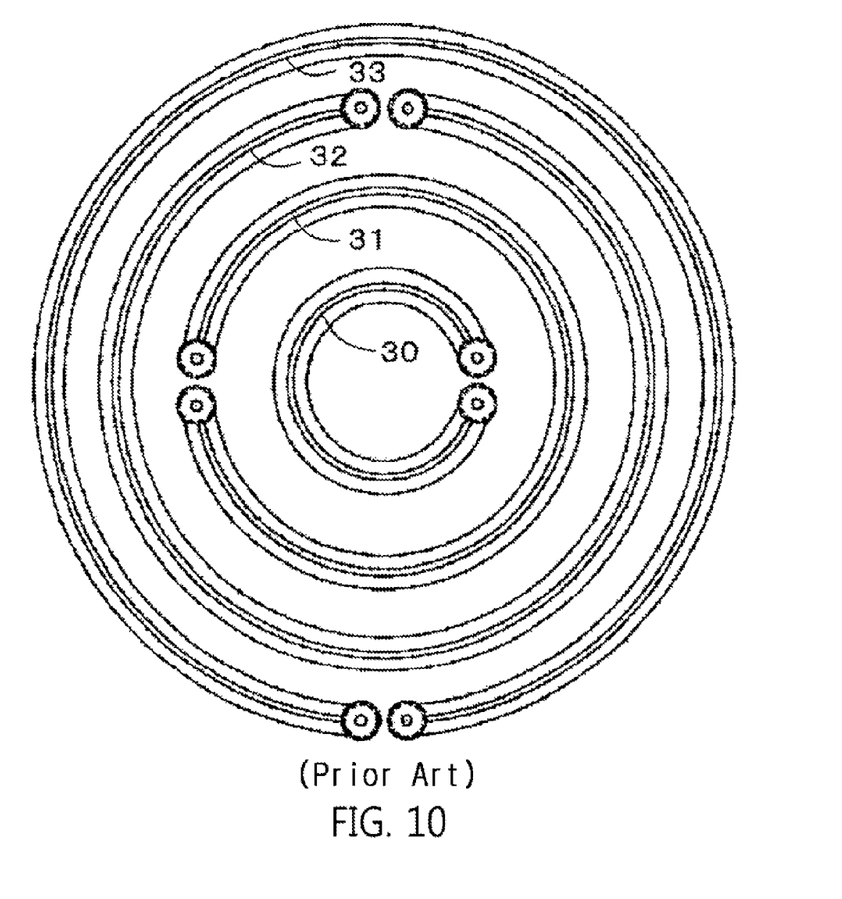
FIG. 10 is a plan view of another conventional technique.

In an effort to overcome the above problem, a heating source having a plurality of annular lamps which face a rotating workpiece was proposed in Japanese Patent Application Publication No. 1999-176389 (Prior Art Document 2). The structure of this heating source is illustrated in FIG. 10. Referring to FIG. 10, the annular lamps 30, 31, 32 and 33 are concentrically arranged. The annular lamps 30, 31, 32 and 33 are individually controlled to uniformly heat the overall area of a workpiece.

Figure 11:
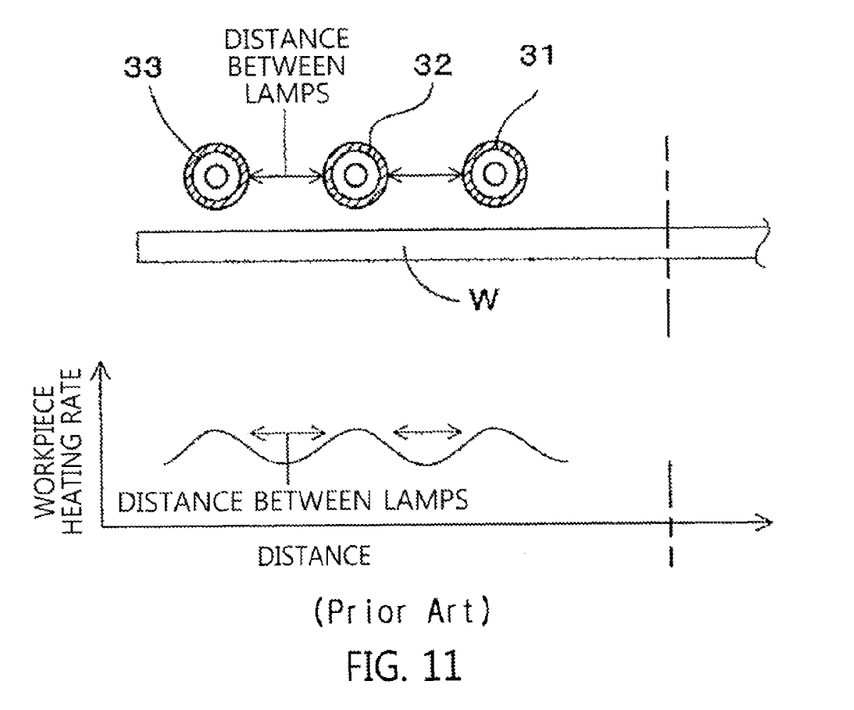
FIG. 11 is a view illustrating problems of the conventional technique of FIG. 9.

However, as shown in FIG. 11, even though the annular lamps that are concentrically arranged on the same plane radiate light onto the workpiece, because areas of the workpiece that correspond to spaces between the lamps do not pass just below the lamps, radiation is applied to these areas with less intensity than it is to those of areas of the workpiece that are disposed just below the lamps. As a result, heating temperature with respect to the radial direction of the workpiece becomes non-uniform.

Furthermore, this conventional technique requires the several annular lamps to be arranged on the same plane, thus making the electrical wiring for the lamps very complex.

PRIOR ART DOCUMENTS

Japanese Patent Application Publication No. 2010-086985
Japanese Patent Application Publication No. 1999-176389

SUMMARY OF THE INVENTION

Accordingly, the present invention has been made keeping in mind the above problems occurring in the prior art, and an object of the present invention is to provide a filament lamp for heating a disk-shaped workpiece in such a way that the filament lamp radiates light onto the disk-shaped workpiece while the filament lamp and the disk-shaped workpiece rotate relative to each other, and a heating apparatus using the filament lamp, and, particularly, to a structure that enables heating temperature to be maintained uniformly on a central portion and a perimeter portion of the disk-shaped workpiece so that the workpiece can be uniformly heated without separately controlling the temperature of the filament lamp.

In order to accomplish the above object, in an aspect, the present invention provides a filament lamp for heating a disk-shaped workpiece in such a way that the filament lamp rotates relative to the disk-shaped workpiece and radiates light thereonto, the filament lamp including: an arc-shaped emitting part extending in a circumferential direction of the relative rotation; and an auxiliary emitting part disposed inside a circle extending along the arc-shaped emitting part and extending from the arc-shaped emitting part in a direction crossing the circle.

The auxiliary emitting part may have a linear shape.

The auxiliary emitting part may be provided in a medial portion of the arc-shaped emitting part.

The auxiliary emitting part may be integrally connected to an end of the arc-shaped emitting part.

The arc-shaped emitting part and the auxiliary emitting part may be integrally formed to be round.

In a filament lamp for heating a disk-shaped workpiece according to the present invention, arc-shaped emitting parts of the filament lamps uniformly heat areas of the workpiece with respect to the circumferential direction. In addition, areas of the workpiece that correspond to spaces between the arc-shaped emitting parts of the filament lamps pass just below corresponding auxiliary emitting parts of the filament lamps when the filament lamps and the workpiece rotate relative to each other. That is, all areas of the workpiece with respect to the radial direction can pass just below the filament lamps. As a result, heating temperature of the areas of the workpiece with respect to the radial direction can also become uniform.

Moreover, because each filament lamp includes the arc-shaped emitting part and the auxiliary emitting part, wiring work can be facilitated using space between the opposite ends of the filament lamp.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Reference now should be made to the drawings, throughout which the same reference numerals are used to designate the same or similar components.

Figure 1:
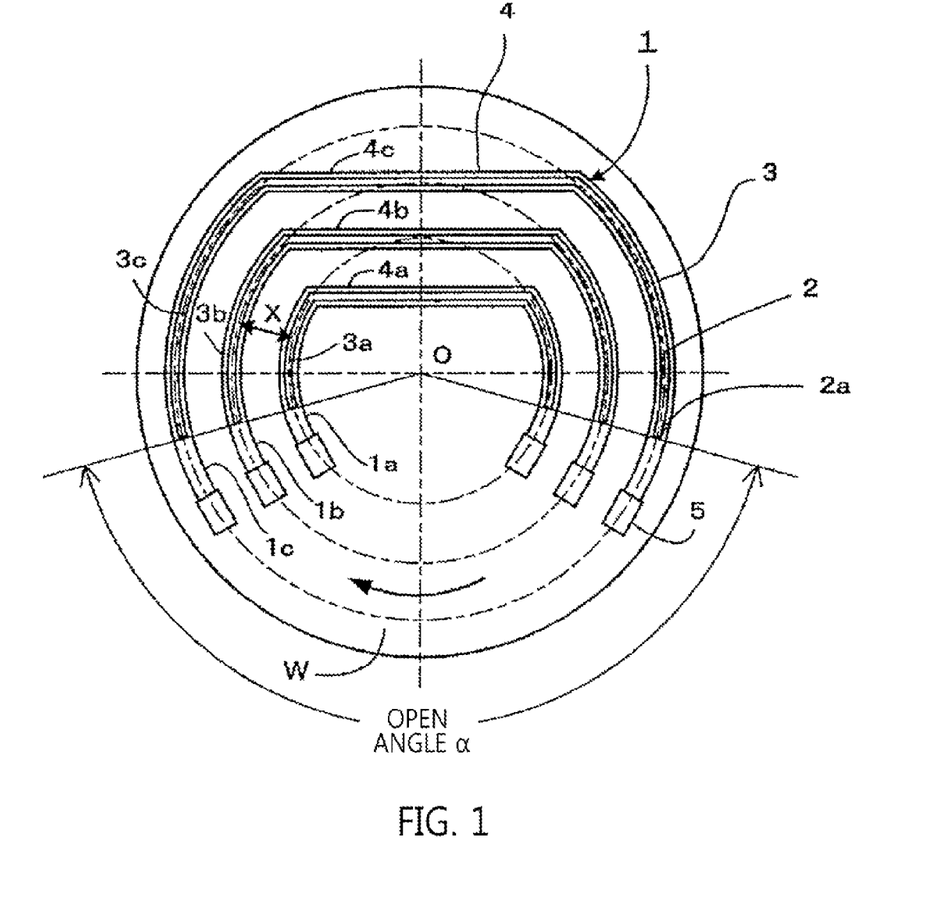
FIG. 1 illustrates filament lamps for heating, according to an embodiment of the present invention.
Figure 2:
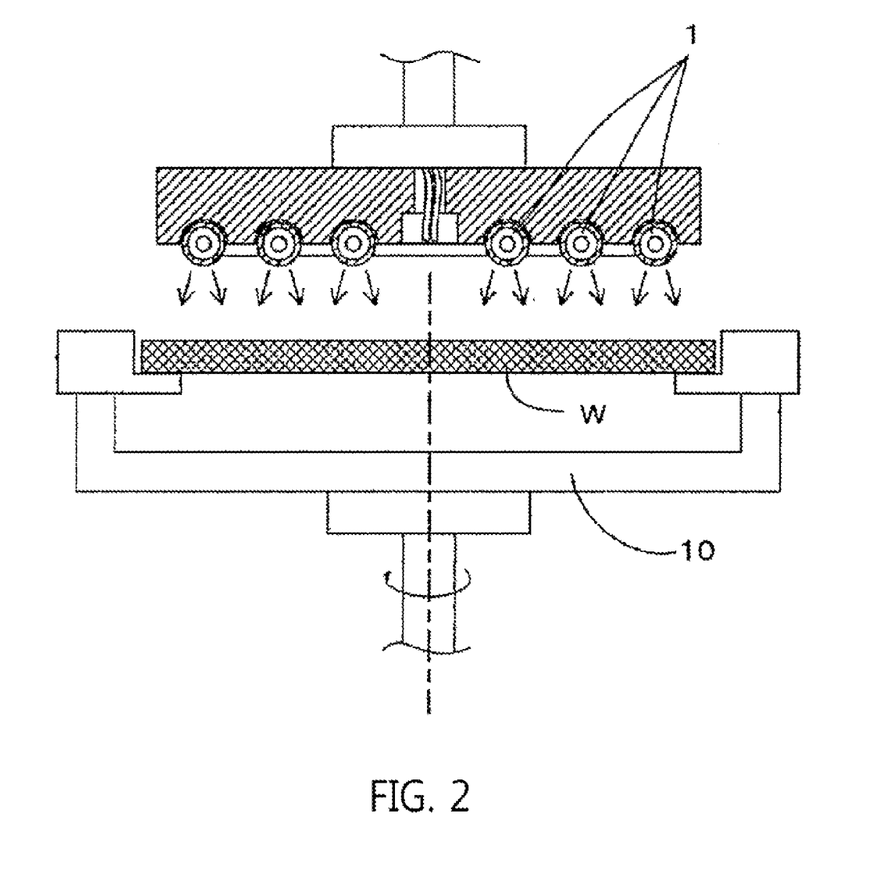
FIG. 2 is a cross sectional view a heating apparatus using the filament lamp of FIG. 1.

FIG. 1 is a partial plan view of a heating apparatus having filament lamps 1 for heating according to the present invention. FIG. 2 is a cross sectional view of the heating apparatus.

As shown in FIGS. 1 and 2, the filament lamps 1 are lamps which radiate light onto a disk-shaped workpiece W to heat it. The filament lamps 1 are concentrically arranged above the workpiece W.

The workpiece W is supported on a support 10. The filament lamps 1 and the workpiece W are rotated relative to each other by rotating the support 10, while the filament lamps 1 radiate light onto the workpiece W and heat it.

In this embodiment, although the workpiece W has been illustrated as rotating, it may be configured such that the filament lamps 1 rotates and the workpiece W is stationary.

The arrangement relationship between the workpiece W and the filament lamp 1 may be inverted, in other words, the filament lamps 1 may be disposed below the workpiece W so that the workpiece W is heated in such a way that light is radiated onto a lower surface of the workpiece W.

As shown in FIG. 1, each filament lamp 1 has a filament 2 therein. The filament lamp 1 includes an arc-shaped emitting part 3 and an auxiliary emitting part 4 which is integrally provided in a medial portion of the arc-shaped emitting part 3.

Each emitting part 3 has an arc shape having a rotating center O of the workpiece W as its center. In the embodiment of FIG. 1, the auxiliary emitting part 4 which is continuously provided in the medial portion of the arc-shaped emitting part 3 has a linear shape.

The auxiliary emitting part 4 is disposed inside a circle extending along the arc-shaped emitting part 3 and extends in such a way that the auxiliary emitting part 4 crosses over the circle. Due to this structure, in the heating apparatus having the filament lamps 1, an annular area X of the workpiece W that is defined between the adjacent two filament lamps 1 passes below the corresponding auxiliary emitting part 4 when the workpiece W rotates.

Therefore, all areas of the workpiece W can pass just below the filament lamps 1 so that non-uniformity in temperature of the workpiece W with respect to the radial direction can be prevented.

Furthermore, although the auxiliary emitting part 4 has been illustrated as being linear, the shape of the auxiliary emitting part 4 is not limited to a linear shape. For example, the auxiliary emitting part 4 may have an arc shape having a different curvature radius from that of the arc-shaped emitting part 3. That is, the auxiliary emitting part 4 can have any shape, so long as it is present inside the circle extending along the arc-shaped emitting part 3 and the area X defined on the workpiece W between the adjacent filament lamps 1 can pass just below the auxiliary emitting part 4 when the workpiece W rotates.

Figure 3A:
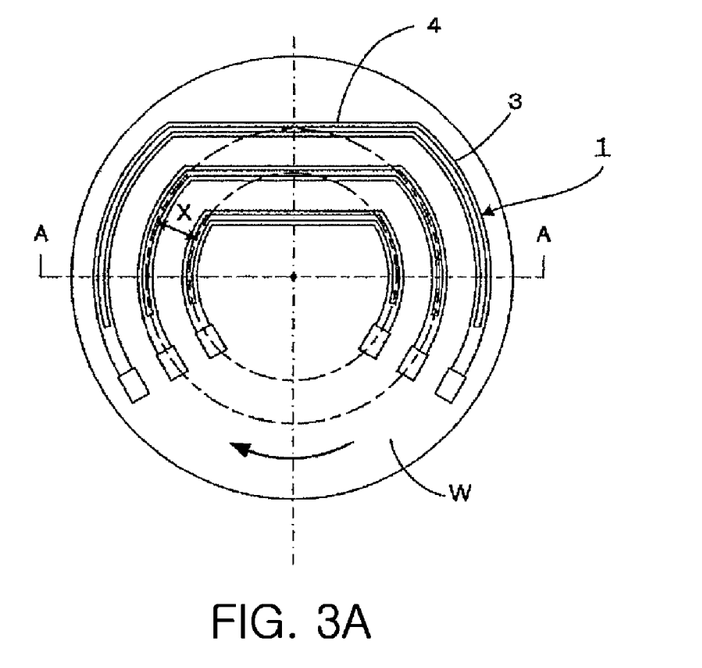
FIG. 3A is a view illustrating the relationship between a workpiece and the filament lamps of the heating apparatus of FIG. 2.
Figure 3B:
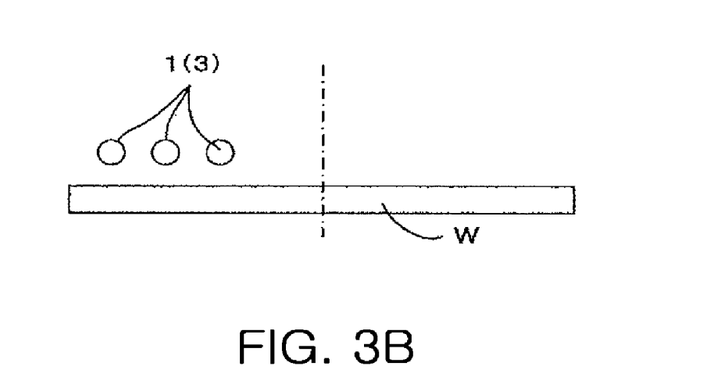
FIG. 3B is a vertical cross-sectional view taken along line A-A, FIG. 3A.
Figure 4A:
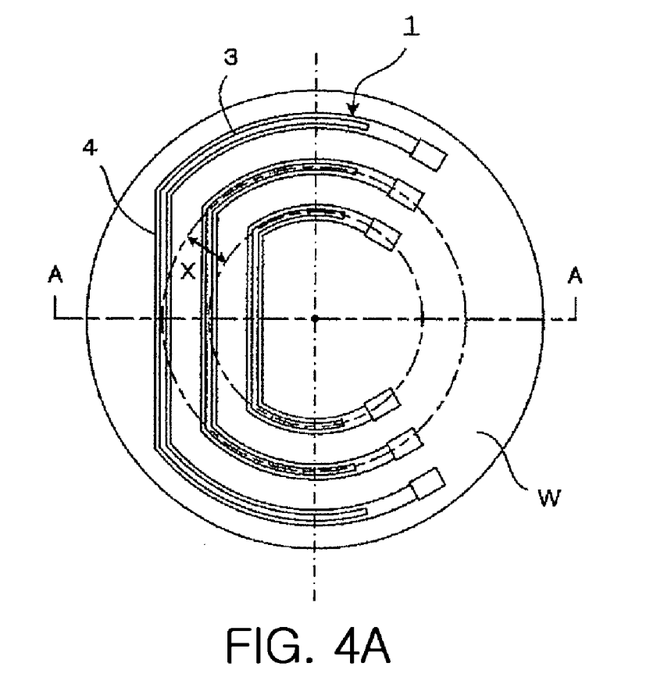
FIG. 4A is a view showing a state which has been rotated to 90° from a state of FIG. 3A.

FIGS. 3A and 4A are views illustrating the above-mentioned operation in different points of view. With regard to these drawings, a state which was rotated to 90° from a state of FIG. 3A is illustrated in FIG. 4A, wherein FIG. 4A shows that only the filament lamps 1 have been rotated 90°. Further, FIG. 3B is a vertical cross-sectional view taken along line A-A of FIG. 3A and FIG. 4B is a vertical cross-sectional view taken along line A-A of FIG. 4A.

Figure 4B:
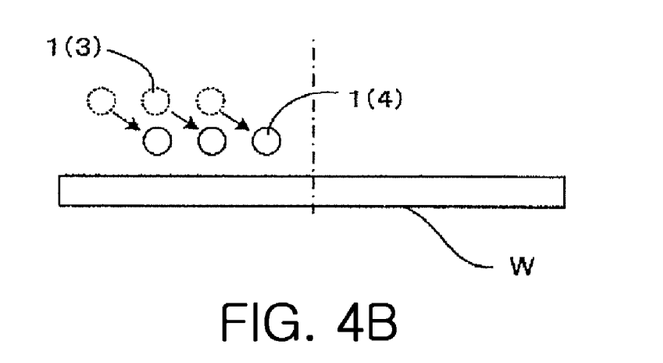
FIG. 4B is a vertical cross-sectional view taken along line A-A, FIG. 4A.

In the case of FIG. 3B, the arc-shaped emitting parts 3 of the filament lamps 1 are disposed at comparatively radially outer portions of the workpiece W, while in the case of FIG. 4B, the auxiliary emitting parts 4 of the filament lamps 1 are disposed at comparatively radially inner portions of the workpiece W. That is, when the workpiece W rotates, the filament lamps 1 act as if they move inwards. Thereby, all areas of the workpiece W with respect to the radial direction can uniformly pass below the filament lamp 1.

Referring again to FIG. 1, the auxiliary emitting part 4 of each filament lamp 1 is preferably configured such that only the annular area X defined on the workpiece W between the arc-shaped emitting parts 3 of the adjacent two filament lamps 1 passes just below the auxiliary emitting part 4 of one of the filament lamps 1 that is disposed at an outer portion. In other words, it is preferable that an area on the workpiece W that has passed just below the arc-shaped emitting part 3 of one of the filament lamps 1 be prevented from also passing just below the auxiliary emitting part 4 of the adjacent outer filament lamp 1. This is because that area that has been heated by the arc-shaped emitting part 3 must be restricted from being heated once more by the auxiliary emitting part 4 of the adjacent outer filament lamp 1.

The above-mentioned arrangement results from the following construction.

In detail, the auxiliary emitting part 4 of one of the filament lamps 1, for example, the auxiliary emitting part 4b of the filament lamp 1b, is disposed inside the circle extending along the arc-shaped emitting part 3b of the filament lamp 1b but does not enter the circle extending along the arc-shaped emitting part 3a of the adjacent inner filament lamp 1a. Thanks to this structure, an area of the workpiece W that is disposed just below the arc-shaped emitting part 3a of the inner filament lamp 1a can be prevented from passing below the auxiliary emitting part 4b of the adjacent filament lamp 1b. Thereby, an area of the workpiece W can be prevented from being doubly heated by the arc-shaped emitting part 1a and the auxiliary emitting part 4b.

Furthermore, as shown in FIG. 1, each filament lamp 1 has a partially open ring shape, rather than having a complete-ring shape that covers the entirety of a circumferential area of the workpiece W.

Each filament lamp 1 includes a rod part and caps 5. Because the filament lamp 1 has a partially open ring shape, wiring work for supply of power which is associated with the caps 5 can be facilitated.

Further, in this case, it is preferable that an open angle α between opposite ends 2a of the filament 2 on the rotating center O of the workpiece W be the same in all the filament lamps 1.

Due to this structure, circumferential lengths of the arc-shaped emitting parts 3 are increased at a predetermined ratio from the center to the perimeter, whereby a rate at which the filament 2 radiates light onto unit circumferential area of the workpiece W can be uniform.

Figure 5:
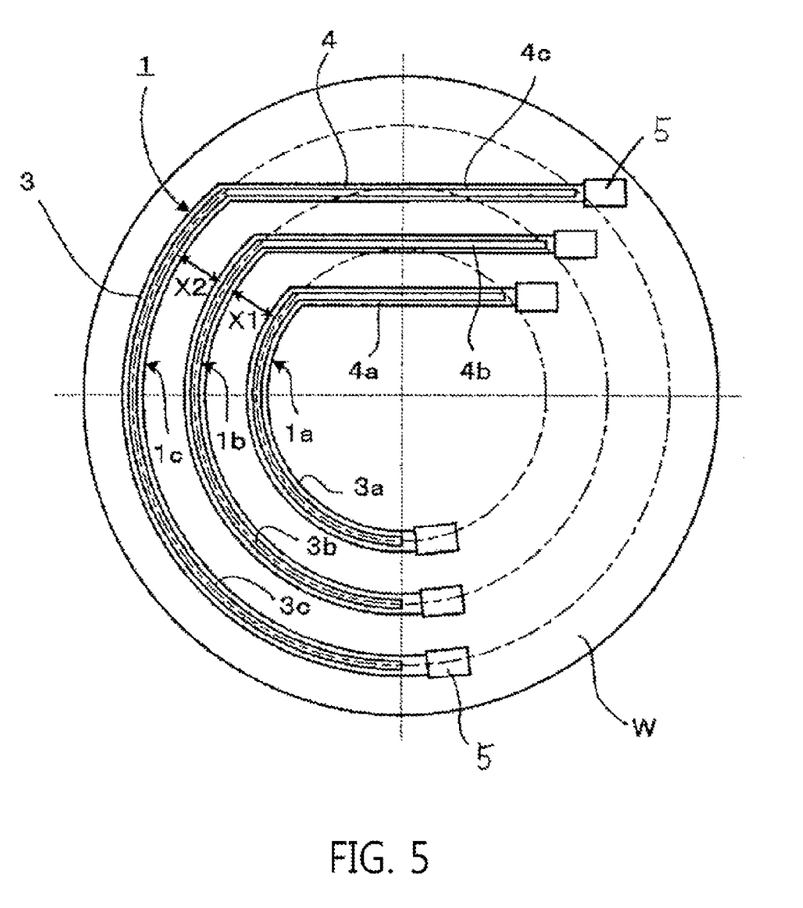
FIG. 5 illustrates another embodiment of the present invention.

In the embodiment of FIG. 1, although the auxiliary emitting part 4 has been illustrated as being provided in the medial portion of the arc-shaped emitting part 3, an auxiliary emitting part 4 may extend from one end of an arc-shaped emitting part 3, as illustrated in another embodiment of FIG. 5.

In detail, the auxiliary emitting part 4 is integrally connected to a first end of the arc-shaped emitting part 3 of the filament lamp 1. Caps 5 are respectively provided on a second end of the arc-shaped emitting part 3 and an end of the auxiliary emitting part 4.

In this embodiment, also, the auxiliary emitting part 4 of the filament lamp 1 is disposed inside a circle extending along the arc-shaped emitting part 3 and extends in such a way that the auxiliary emitting part 4 crosses over the circle.

Further, in the same manner as the embodiment of FIG. 1, it is preferable that the auxiliary emitting part 4 of one of the filament lamps 1, for example, the auxiliary emitting part 4b of the filament lamp 1b, do not enter the circle extending along the arc-shaped emitting part 3a of the adjacent inner filament lamp 1a.

In addition, it is preferable that the auxiliary emitting part 4b be prevented from extending to the outside of the circle extending along the arc-shaped emitting part 3b. The auxiliary emitting part 4b of the filament lamp 1b functions to radiate light onto an annular area X1 defined between the arc-shaped emitting part 3b of the filament lamp 1b and the arc-shaped emitting part 3a of the adjacent inner filament lamp 1a. If the auxiliary emitting part 4b extends to the outside of the circle extending along the arc-shaped emitting part 3b, it enters an annular area X2 between the arc-shaped emitting part 3b of the filament lamp 1b and the arc-shaped emitting part 3c of the adjacent outer filament lamp 1c. In this case, the annular area X2 is doubly heated, because the annular area X2 is originally governed by the auxiliary emitting part 4c of the filament lamp 1c. Therefore, to avoid this problem, the auxiliary emitting part 4b is preferably prevented from extending to the outside of the circle extending along the arc-shaped emitting part 3b.

Figure 6:
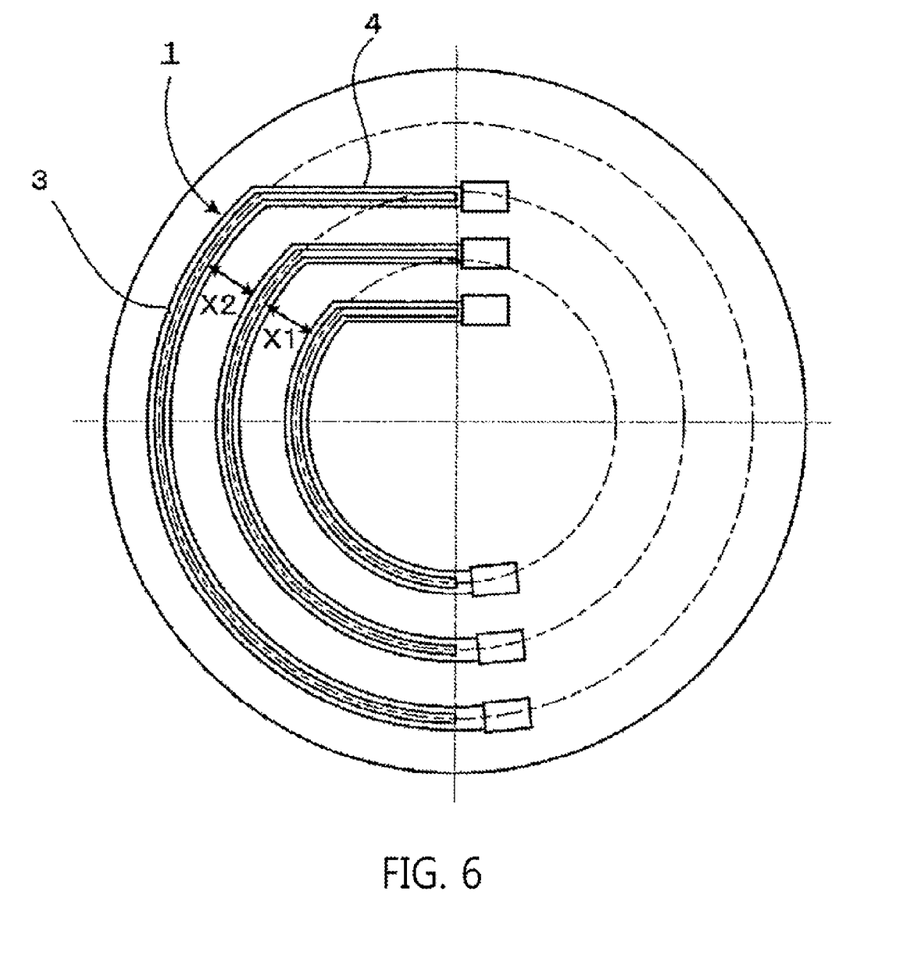
FIG. 6 is a view showing a modification of the embodiment of FIG. 5.

In the embodiment of FIG. 5, each auxiliary emitting part 4 has been illustrated as twice crossing over the corresponding annular area X defined between the shaped emitting parts 3 of the adjacent filament lamps 1, wherein the annular area X is heated twice by the corresponding auxiliary emitting part 4 while the workpiece W makes one revolution. On the other hand, as shown in FIG. 6, depending on the extent of temperature uniformity, the auxiliary emitting part 4 may be configured such that it extends to a half of the annular area X so that light is radiated once onto the annular area X when the workpiece W makes one revolution.

Figure 7:
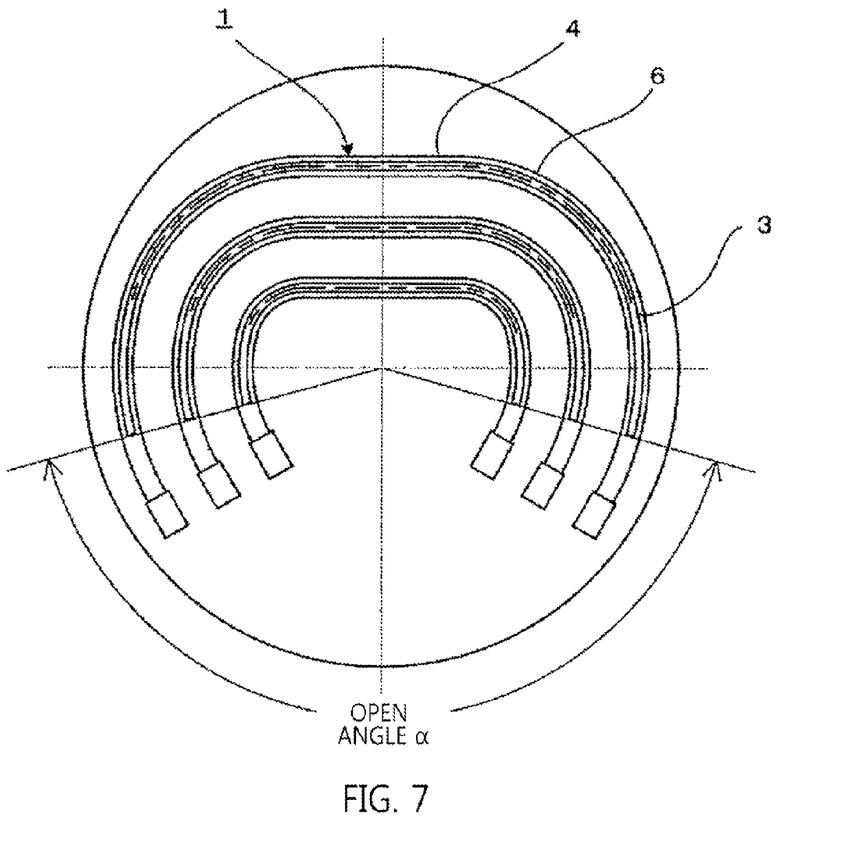
FIG. 7 illustrates a further embodiment of the present invention.

Furthermore, referring to FIG. 7, as designated by reference numeral 6, the arc-shaped emitting part 3 and the auxiliary emitting part 4 of each filament lamp 1 may be integrally formed to be round. In the case of an angular shape, a light emitting tube of the filament lamp 1 may be damaged by stress concentration. To avoid such a stress concentration phenomenon, it is more preferable that the filament lamp 1 be formed to be round.

A numerical example of the heating apparatus with three filament lamps 3 having the shape of FIG. 1 is as follows.

<Filament Lamp 1a>
Light emitting tube of filament lamp: φ 10 mm
Arc-shaped emitting part: Radius of 50 mm (diameter of 100 mm) on rotating center O
Auxiliary emitting part: 80 mm
Open angle α: 150°
Lighting conditions: Maximum output 200V-800 W, controlled depending on temperature of workpiece <Filament Lamp 1b>
Arc-shaped emitting part: Radius of 100 mm (diameter of 200 mm) on rotating center O
Auxiliary emitting part: 120 mm
Open angle α: 150°
Lighting conditions: Maximum output 200V-1500 W, controlled depending on temperature of workpiece <Filament Lamp 1c>
Arc-shaped emitting part: Radius of 150 mm (diameter of 300 mm) on rotating center O
Auxiliary emitting part: 160 mm
Open angle α: 150°
Lighting conditions: Maximum output 200V-2200 W, controlled depending on temperature of workpiece On the other hand, a numerical example of the conventional heating apparatus with three filament lamps 30, 31 and 32 having the shape of FIG. 10 is as follows.

Figure 8:
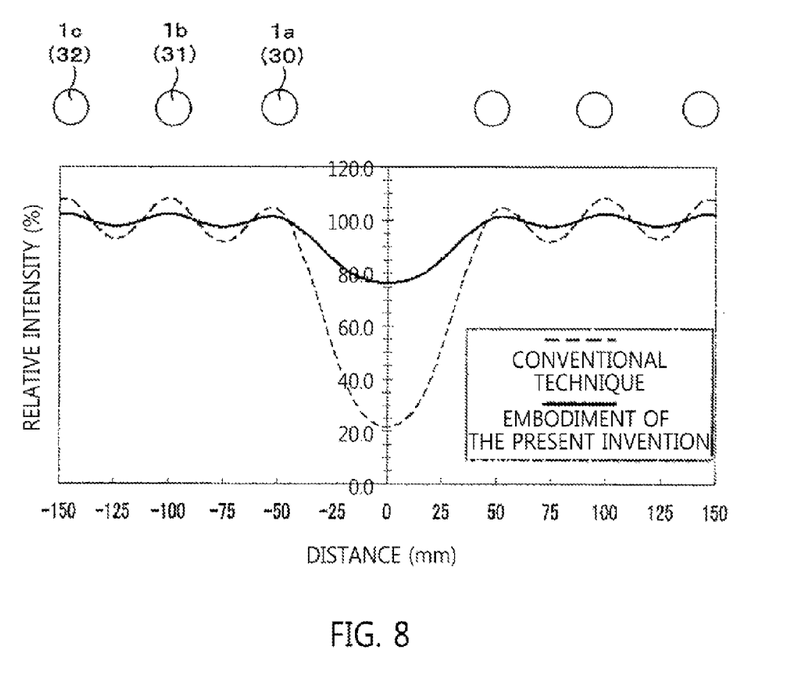
FIG. 8 is a graph showing the effects of the present invention.

<Filament Lamp 30>
Light emitting tube of filament lamp: φ 10 mm
Annular filament lamp of φ 100 mm
Lighting conditions: Maximum output 200V-800 W, controlled depending on temperature of workpiece <Filament Lamp 31>
Annular filament lamp of φ 200 mm
Lighting conditions: Maximum output 200V-1500 W, controlled depending on temperature of workpiece <Filament Lamp 32>
Annular filament lamp of φ 300 mm
Lighting conditions: Maximum output 200V-2200 W, controlled depending on temperature of workpiece Simulations of heating performance of the heating apparatuses having the above-stated conditions were performed, and the results thereof are illustrated in FIG. 8. In the drawing, the solid line illustrates the embodiment of the present invention, and the dotted line shows the conventional embodiment.

Referring to the dotted line showing the conventional embodiment, relative intensities of heating is high on areas just below the lamps 30, 31 and 32 but is low on areas between the lamps 30, 31 and 32. Therefore, there is a problem with the temperature uniformity with respect to the radial direction. Particularly, a rate of diminution of intensity on an area inside the innermost lamp 30 is very high.

On the other hand, in the present invention, as shown by the solid line, relative intensities of heating are comparatively high on areas between the arc-shaped emitting parts 3 of the filament lamps 1. That is, it can be understood that the temperature uniformity with respect to the radial direction be markedly improved. Further, relative intensity of heating is markedly enhanced even on an area inside the innermost filament lamp 1a.

These effects of the present invention result from the fact that the auxiliary emitting parts 4 which integrally extend from the respective arc-shaped emitting parts 3 are present inside the corresponding circles extending along the arc-shaped emitting parts 3 so that the areas defined on the workpiece W among the filament lamps 1 are radiated by the auxiliary emitting parts 4, and the area inside the innermost filament lamp 1*a* is radiated by the auxiliary emitting part 4*a*.

As described above, a filament lamp for heating according to the present invention includes an arc-shaped emitting part which circumferentially extends and radiates light onto a workpiece while rotating relative to the workpiece, and an auxiliary emitting part which is disposed inside a circle extending along the arc-shaped emitting part and extends in a direction crossing the circle. Furthermore, in a heating apparatus according to the present invention, a plurality of filament lamps that have the above structure are concentrically arranged. An area defined on the workpiece between the adjacent arc-shaped emitting parts passes just below the corresponding auxiliary emitting part so that the intensity of radiation on this area is increased, whereby the intensity of radiation on the workpiece with respect to the radial direction can become uniform. As a result, the temperature uniformity can be markedly enhanced.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A filament lamp for heating a disk-shaped workpiece in such a way that the filament lamp radiates light onto the disk-shaped workpiece while the filament lamp and the disk-shaped workpiece rotate relative to each other, the filament lamp comprising:
    an arc-shaped emitting part extending in a circumferential direction of the relative rotation; and
    an auxiliary emitting part disposed inside a circle extending along the arc-shaped emitting part and extending from the arc-shaped emitting part in a direction crossing the circle.

2. The filament lamp as set forth in claim 1, wherein the auxiliary emitting part has a linear shape.

3. The filament lamp as set forth in claim 1, wherein the auxiliary emitting part is provided in a medial portion of the arc-shaped emitting part.

4. The filament lamp as set forth in claim 2, wherein the auxiliary emitting part is provided in a medial portion of the arc-shaped emitting part.

5. The filament lamp as set forth in claim 1, wherein the auxiliary emitting part is integrally connected to an end of the arc-shaped emitting part.

6. The filament lamp as set forth in claim 2, wherein the auxiliary emitting part is integrally connected to an end of the arc-shaped emitting part.

7. The filament lamp as set forth in claim 1, wherein the arc-shaped emitting part and the auxiliary emitting part are integrally formed to be round.

8. The filament lamp as set forth in claim 2, wherein the arc-shaped emitting part and the auxiliary emitting part are integrally formed to be round.

* * * * *